(12) United States Patent
Dyckman et al.

(10) Patent No.: US 6,657,864 B1
(45) Date of Patent: Dec. 2, 2003

(54) HIGH DENSITY THERMAL SOLUTION FOR DIRECT ATTACH MODULES

(75) Inventors: Warren D. Dyckman, Peekskill, NY (US); Edward R. Pillai, Wappingers Falls, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/320,845

(22) Filed: Dec. 16, 2002

(51) Int. Cl.$^7$ ................................................. H05K 7/20
(52) U.S. Cl. ....................... 361/704; 361/718; 361/719; 361/708; 257/706; 165/80.2; 165/80.3
(58) Field of Search ................................. 361/704, 705, 361/706, 708, 707, 718, 719, 712, 713; 257/706, 707; 165/80.2, 80.3, 185

(56) References Cited

U.S. PATENT DOCUMENTS

| | | | |
|---|---|---|---|
| 5,307,237 A | | 4/1994 | Walz |
| 5,710,459 A | | 1/1998 | Teng et al. |
| 5,792,677 A | | 8/1998 | Reddy et al. |
| 5,831,825 A | | 11/1998 | Fromont |
| 5,847,936 A | * | 12/1998 | Forehand et al. ............ 361/794 |
| 5,892,657 A | * | 4/1999 | Inoue .......................... 361/704 |
| 5,926,369 A | | 7/1999 | Ingraham et al. |
| 5,982,630 A | | 11/1999 | Bhatia |
| 6,008,536 A | | 12/1999 | Mertol |
| 6,023,098 A | | 2/2000 | Higashiguchi et al. |
| 6,156,980 A | | 12/2000 | Peugh et al. |
| 6,175,497 B1 | | 1/2001 | Tseng et al. |
| 6,201,300 B1 | | 3/2001 | Tseng et al. |
| 6,317,333 B1 | * | 11/2001 | Baba ........................... 361/795 |
| 6,326,244 B1 | * | 12/2001 | Brooks et al. ............... 438/124 |
| 6,349,033 B1 | * | 2/2002 | Dubin et al. ................. 361/704 |
| 6,437,240 B2 | * | 8/2002 | Smith ......................... 174/52.2 |
| 6,552,907 B1 | * | 4/2003 | Caldwell ..................... 361/708 |

* cited by examiner

*Primary Examiner*—Boris Chervinsky
(74) *Attorney, Agent, or Firm*—James J. Cioffi

(57) ABSTRACT

A high power density thermal packaging solution. A highly efficient thermal path is provided using a lid of a unique design configuration that connects the chip back-side to both a heat sink and thermally conductive substrate vias thus establishing two thermal paths to carry heat from the die. The thermal interface between the chip back-side to lid and lid-to-substrate is enhanced with a thermally conductive elastomer. The heat is conducted through the substrate through thermal vias that are added to the perimeter of the substrate or which may be configured from preexisting electrical shielding structures that connect the top surface of the substrate to the bottom of the package. The bottom surface connection then conducts the heat to a copper ground plane in the printed circuit card. The heat from the die to the heat sink is transferred in the conventional method using the thin layer of thermally conductive elastomer to complete the thermal path from chip to lid to heat sink.

17 Claims, 3 Drawing Sheets

HIGH DENSITY THERMAL SOLUTION FOR DIRECT ATTACH MODULES

BACKGROUND OF THE INVENTION

The present invention is directed to microelectronics packaging and more particularly to a method and structure for conducting and dissipating heat from an integrated circuit chip for purposes of thermal management of such devices.

In the field of integrated high speed microcircuit packaging, silicon germanium (SiGe) and other chip technologies can frequently exhibit the property of high thermal density. A high thermal density chip application is typically considered to be equal to or greater than 40 W/cm$^2$. When the specified operating ambient temperature is 70 degrees Celsius, as in the case of synchronous optical network/asynchronous transfer mode.(SONET/ATM ) applications, conventional thermal solutions are no longer capable of being used. The present invention addresses the design issues related to high thermal density applications in the forming of a practical thermal solution for high speed chip packaging of this area of applications.

Silicon Germanium Bipolar Junction Transistor architecture used in high speed (typically greater than 1 GHz) RF/Optoelectronic applications exhibit a very high power density, typically at least 40 W/cm$^2$. With the nominal operating ambient temperature of 70° C., small chip size (typically 6.5 mm$^2$ or less), and a low number of controlled collapse chip connections (C4's), i.e., the contact point on the top surface metallurgy (TSM) in a substrate, this form of application requires an enhanced thermal solution. The chip input/output ('I/O") typically consists of the high speed nets on the periphery of the array and the voltages, grounds and controls distributed across the entire C4 array. The chip can be designed for any combination of peripheral and or area array as required by the application.

A thermal solution for high power density applications, where the ambient temperature is approximately 70° C. and the maximum transistor junction temperature is approximately 110° C., is impossible to achieve with normal techniques such as direct lid attach (DLA) and thermally conductive grease with cap and heat sink. These applications employ physically small SiGe chip of typically less than 6.5 mm$^2$. Small chips cannot be cooled with standard DLA solutions because they lack the mechanical strength to support a suitable heat sink structure. Chips less than 6,5 mm$^2$ do not have the mechanical strength at the C4/TSM solder interface to reliably support a DLA thermal solution. The number of C4's on the small chip restricts the heat flow into the substrate or chip carrier and this limits the effectiveness of the thermal flow in that direction.

Accordingly, it is a purpose of the present invention to provide an improved thermal path into the substrate which bypasses the C4's, and which directs the heat into metal vias designed into the substrate and which may also connect into a thermal dissipating metal mesh within the substrate. The mechanical interface between the chip backside and proposed solution is decoupled and the thermal conduction path is enhanced by using a thin gap and thermally conductive grease. The proposed thermal solution provides an enhanced thermal path between the chip and the substrate, and the substrate and the printed circuit board without compromising the reliability of the chip C4 to substrate TSM solder interface.

This thermal solution does not depend on the chip C4's to conduct the chip's dissipated heat to the substrate and second level (substrate to circuit board) attachment. This enables the heat to flow into the second level assembly which effectively doubles the thermal flow away from the chip as compared to a standard thermal solution.

These and other purposes of the present invention will become more apparent after referring to the following description considered in conjunction with the accompanying drawings.

BRIEF SUMMARY OF THE INVENTION

The purposes of the present invention have been achieved by providing a high power density thermal packaging structure comprising:

a printed circuit board having a plurality of top surface connection pads and horizontal metal planes within the printed circuit board connected to the plurality of top surface connection pads;

a ceramic substrate having a first plurality of vertical vias which electrically connect the ceramic substrate top surface and bottom surface, the ceramic substrate attached to the printed circuit board top surface with a first solder connection, this first solder connection is typically a solder ball grid array or solder column grid array;

an integrated circuit chip having a plurality of bottom surface connection pads, the integrated circuit chip attached to the ceramic substrate top surface with a second solder connection between the first plurality of vertical vias and the plurality of integrated circuit chip bottom surface connection pads, this second solder connection is typically a C4 solder connection;

a second plurality of vertical vias arrayed on the perimeter of the ceramic substrate and connecting the ceramic substrate top surface and bottom surface, the second plurality of vertical vias also attached to the printed circuit board top surface with the first solder connection between the second plurality of vertical vias and the plurality of printed circuit board top surface connection pads;

a first layer of a thermally conductive elastomer on the integrated circuit chip top surface;

a second layer of a thermally conductive elastomer on a perimeter portion of the ceramic substrate top surface; and a lid having a top surface and a perimeter bottom surface and a recess portion, the recess portion in contact with the first layer of a thermally conductive elastomer and the perimeter bottom surface in contact with the second layer of a thermally conductive elastomer and in thermal contact with the second plurality of vertical vias and attached to the ceramic substrate top surface.

The high power density thermal packaging structure may further comprise:

horizontal metal planes within the ceramic substrate connected to the second plurality of vias;

a third layer of a thermally conductive elastomer on the lid top surface; and a heat sink in contact with the third layer of thermally conductive elastomer and attached to the lid top surface thereby providing a thermally conductive interface between the lid and the heat sink.

The present invention also discloses a method for providing a high power density thermal packaging solution comprising the steps of:

providing a printed circuit board having a plurality of top surface connection pads and horizontal metal planes within the printed circuit board connected to the plurality of top surface connection pads;

providing a ceramic substrate having a first plurality of vertical vias which electrically connect the ceramic substrate top surface and bottom surface, a second plurality of vertical vias arrayed on the perimeter of the ceramic substrate and connecting the ceramic substrate top and bottom surface, and horizontal metal planes within the ceramic substrate connected to the second plurality of vias;

providing an integrated circuit chip having a plurality of bottom surface connection pads;

applying a first layer of a thermally conductive elastomer on the integrated circuit chip top surface;

applying a second layer of a thermally conductive elastomer on a perimeter portion of the ceramic substrate top surface;

attaching the integrated circuit chip to the ceramic substrate top surface with a solder connection between the first plurality of vertical vias and the plurality of integrated circuit chip bottom surface connection pads;

providing a lid having a top surface and a perimeter bottom surface and a recess portion;

attaching the lid to the integrated circuit chip top surface so that the recess portion is in contact with the first layer of thermally conductive elastomer and attaching the perimeter bottom surface portion to the ceramic substrate so that the bottom surface portion is in contact with the second layer of thermally conductive elastomer; and attaching the ceramic substrate to the printed circuit board top surface with a solder connection between the first plurality of vertical vias and the plurality of printed circuit board top surface connection pads and between the second plurality of vertical vias and the plurality of printed circuit board top surface connection pads, thereby providing an additional parallel lid to card path resistance.

The method may further comprise the steps of:

applying a third layer of a thermally conductive elastomer on the lid top surface; and attaching a heat sink on the third layer of thermally conductive elastomer and the lid top surface thereby providing a thermally conductive interface between the lid and heat sink.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
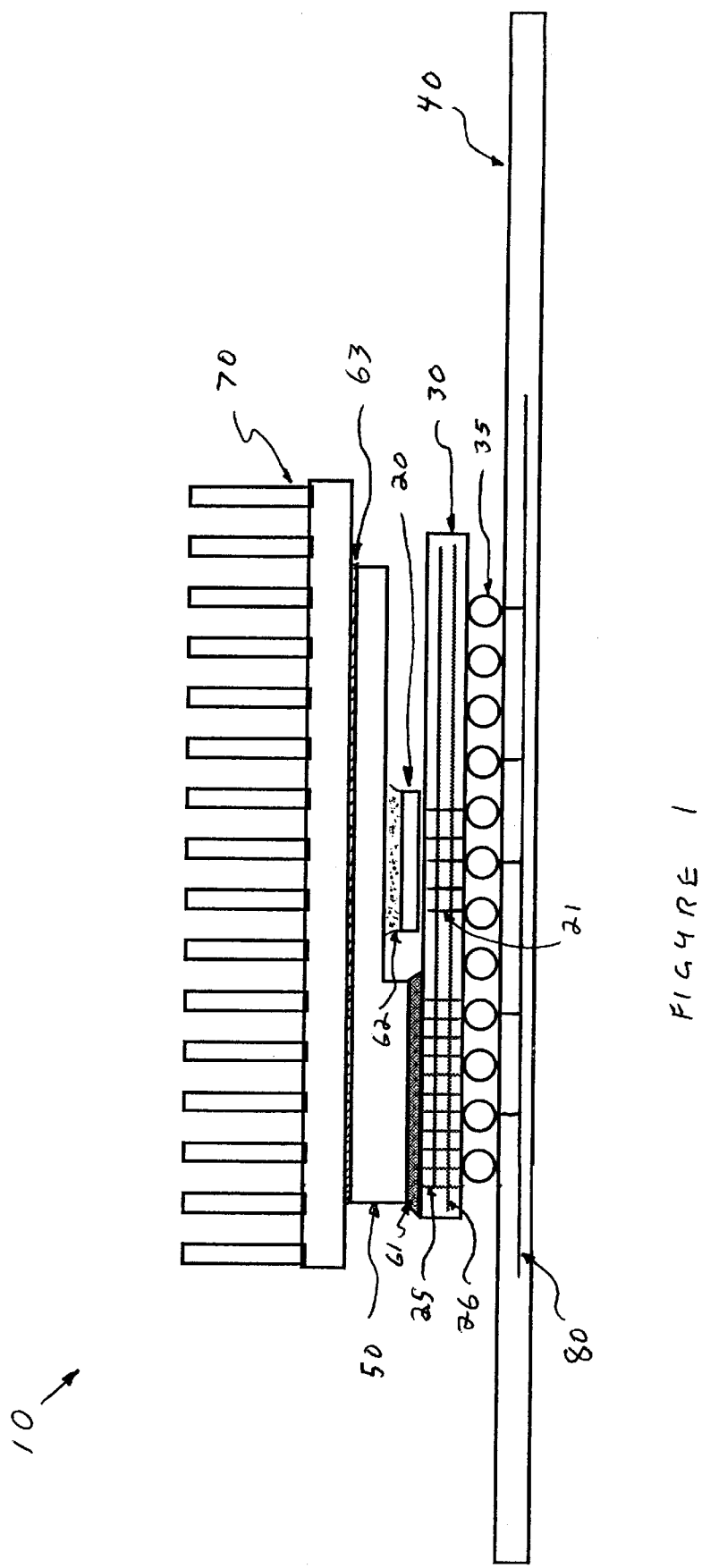
FIG. 1 is a schematic cross section view of an enhanced thermal structure according to the present invention.

The purposes of the present invention have been achieved by providing a highly efficient method of conducting heat away from thermally dense chips in the C4 or "flip chip" configuration, where standard solutions are not possible due to their inherent mechanical, geometric or performance limitations. In addition to a C4 or flip chip application, the thermal solution of the present invention can be configured with a single chip side substrate attachment, dual side attachment or a chip cavity with continuous attachment that results with the sealing of the chip inside the thermal solution.

This purpose is achieved by establishing a highly efficient thermal path with a lid of a unique design configuration that connects the chip back-side to not only a heat sink, but also to the thermally conductive substrate, thereby establishing two thermal paths to carry heat from the chip. The interface between the chip back-side to lid and lid-to-substrate is thermally enhanced through thin films of a thermally conductive elastomer.

The heat is conducted through the substrate through metal vias that are added to the perimeter of the substrate. Alternatively, the metal vias utilized as a thermal path may be configured from preexisting electrical shielding structures. In either case the metal vias connect the top surface of the substrate to the solder connection between the substrate and PCB. An example would be a ball grid array (BGA) on the bottom of the package. The BGA then conducts the heat to the copper ground planes in the printed circuit board (PCB). The heat from the chip to the heat sink is transferred in the conventional method using the thin layer of thermally conductive elastomer to complete the thermal path from chip to lid to heat sink.

There are two primary design problems that this invention addresses. The first design problem is related to the cooling of a small chip with high thermal density. The second design problem is related to the mechanical interfacing of the chip such that reliability is maintained while not interfering with the electrical performance of the chip. This form of high thermal density application frequently features a chip size of less than 6.5 mm square. Because of the small chip size it is impossible to directly attach a thermal solution on the chip backside because it would compromise the integrity of the mechanical interface of the C4 chip contacts and/or the chip-to-lid thermal interface in normal applications.

The thermal solution of the present invention utilizes the chip carrier substrate as a mechanical and thermal interface and significantly reduces the stress of the thermal solution mechanical load to the small chip. One primary benefit of this solution is that it supports a thin gap between the chip and substrate where a thermally conductive elastomer is used as the interface to the thermal spreader or heat sink. This forms a highly efficient thermal circuit connecting to both the chip back-side, heat sink and the substrate where perimeter metal vias in the substrate, but located outside the chip active area, conduct the heat to the substrate bottom surface metallurgy (BSM) solder connections, to the PCB, and finally to the copper ground planes in the PCB.

This thermal solution methodology adds a secondary thermal path. This second thermal path is through the substrate and may utilize existing electrically required RF'shielding via structures. This creates a second thermal path, in addition to the thermal path from the sink heat, from the chip into the circuit card without sacrificing any of the packages' wireability to do so.

Referring to FIG. 1 there is shown a cross section of an enhanced thermal structure 10 for high speed applications with high thermal density and using C4 (Flip-Chip) and BGA interconnect technology. An integrated circuit chip 20 is attached to the TSM of a ceramic substrate 30 using a conventional C4 solder attach (not shown). The ceramic substrate 30 is attached to a printed circuit board 40 using a conventional solder ball grid array 35. In a preferred embodiment the solder balls are composed of a 90% Pb/10% Sn alloy.

While the embodiment shown in FIG. 1 is directed to a ball grid array, the present invention is not limited to a ball grid array. It is also applicable to a column grid array or land grid array (LGA) structure. The land grid array socket contact design must be designed to incorporate a low thermal resistance path to the copper ground plane in the printed circuit board in order to be effective. Column and ball grid arrays use metallic alloys that provide an excellent thermal path for this form of thermal solution.

Referring again to FIG. 1 the ceramic substrate 30 is designed with vertical columns of conductive metal paste commonly referred to as vias 21, 25. The thermal vias 25 originate on the top surface of the substrate 30 and connect to the bottom surface of the substrate 30. The thermal vias 25 may form a single column from the top of the substrate to the bottom, or alternatively, they may be broken by one or more horizontal jogs in the substrate. These thermal vias 25 provide a thermal path from the chip 20 to the printed circuit board 40. The thermal vias 25 in this example are used for high frequency applications and have no electrical connection purpose. They are positioned in a perimeter pattern about the chip 20 to provide electrical shielding. However, they are otherwise the same as standard substrate interconnect vias 21 which are positioned in an array under the chip to provide electrical connections from the chip 20 to the printed circuit board 40. In a preferred embodiment the vias 21, 25 have a diameter of approximately 0.004 inches. The via to via pitch or spacing is ideally in the range of about 225 $\mu$m to about 900 $\mu$m.

The thermal vias 25 may also connect with horizontal planes of metal 26 within the ceramic substrate 30. The present invention utilizes electrical shielding vias to serve as thermal vias with the additional purpose of conducting heat from the chip 20. Depending on the electrical shielding and thermal management requirements of a particular design, additional vias, over and above the number required just for electrical shielding may be required.

Referring again to FIG. 1 a lid 50 having a clearance recess for the chip 20 is placed over the chip 20 and attached to the ceramic substrate 30 top surface. In a preferred embodiment the lid 50 is made from an aluminum material such as AL 6061. A thin layer of a thermally conductive elastomer 61 provides the adhesion between the lid 50 and ceramic substrate 30. In a preferred embodiment the thermally conductive elastomer is a silicone adhesive such as GE 3281. The recess in the lid 50 is designed to leave a predetermined gap between the top of the chip and the lid. A thin layer of the thermally conductive elastomer 62 is also placed on the top of the chip 20. The recess in the lid 50 and the thickness of the layer of thermally conductive elastomer 62 are such that the gap above the chip 20 and below the lid 50 is filled with the thermally conductive elastomer 62.

The thermally conductive elastomer 61, 62 serves the additional purpose of providing a thermally conductive interface between the chip 20 and lid 50, and between the lid 50 and ceramic substrate thermal vias 25. A thermally conductive elastomer 63 is then applied to the top surface of the lid 50 and a heat sink 70 is then attached to the top surface of the lid 50 with the thermally conductive elastomer 63 providing a thermally conductive interface between the lid 50 and the heat sink 70. The interconnect vias 21, positioned under the chip, provide electrical contact from chip 20 to printed circuit board 40. The interconnect vias 21 do not contact the lid 50. The thermal vias 25 are arrayed around the chip and contact the lid 50 to provide a parallel heat path from the chip 20.

Referring again to FIG. 1 the printed circuit board 40 contains copper ground planes 80 which are in both electrical and thermal contact with the ball grid array 35. It can now be seen that the present invention provides the following thermal path. Heat generated in the chip 20 passes through the thermally conductive elastomer 62 into the lid 50. Some heat then passes through the thermally conductive elastomer 63 and into the heat sink 70. The present invention provides an additional source of heat dissipation since heat generated in the chip 20 will also pass through the lid 50 into the thermally conductive elastomer 61 and into the conductive metal vias 25 in the perimeter region of the ceramic substrate 30. The heat will then pass through the metal vias 25 and horizontal planes of metal 26 within the ceramic substrate 30 and into the solder ball grid array 35 and finally into the copper ground planes 80 in the printed circuit board.

In a preferred embodiment of the enhanced thermal structure 10 the ceramic substrate 30 is a cordierite glass ceramic material and the metal vias 21, 25 and horizontal planes of metal 26 are made from a conductive copper paste. In another embodiment of the enhanced thermal structure the ceramic substrate 30 is an alumina material and the metal vias 21, 25 and horizontal planes of metal 26 are made from a conductive molybdenum paste.

Figure 2:
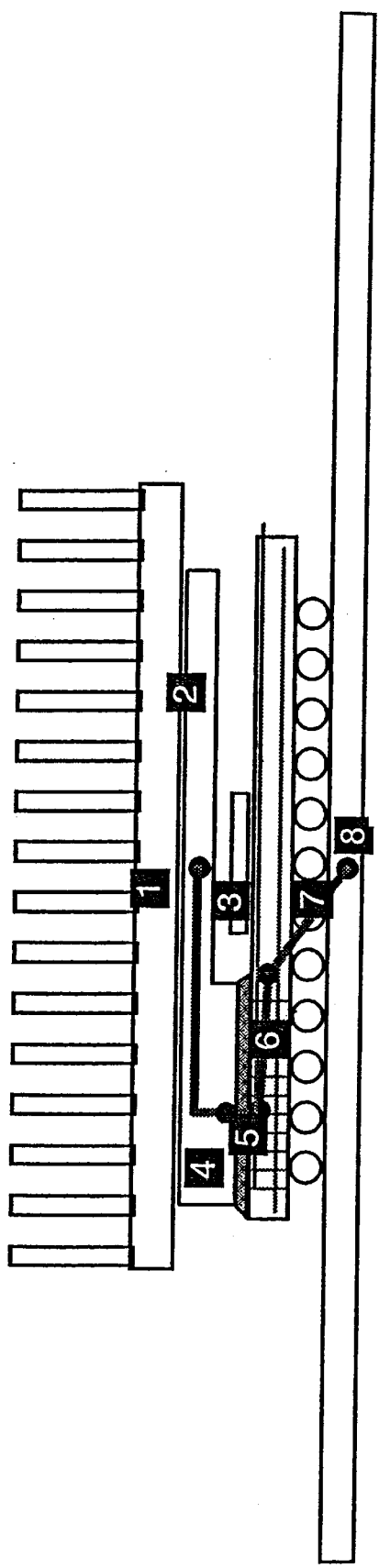
FIG. 2 is a schematic illustration of the additional thermal resistance $R_2$ component created by the present invention.

Referring now to FIG. 2 there is shown a schematic representation of the additional parallel lid-to-card thermal path resistance $R_2$ which is provided by the present invention and illustrated as path 3-4-5-6-7-8. In path 3-4 the heat is conducted from the chip through the thermally conductive elastomer and into the lid. In-path 4-5 the heat is conducted from the lid through the thermally conductive elastomer and into the metal vias at the top surface of the substrate perimeter. In path 5-6-7 the heat is conducted through the metal vias and connecting metal planes in the substrate and into the solder ball connections on the bottom of the substrate. In path 7-8 the heat is conducted from the solder ball connections and then into the PCB connections and internal metal planes.

The inherent thermal path resistance R. is illustrated as path 2-1 and is the heat dissipated through the lid and into the heat sink. The total package thermal resistance $R_T$ is given by the equation $1/R_T = 1/R_1 + 1/R_2$. The addition of the second thermal path $R_2$ of the present invention provides a secondary parallel path for heat generated at the chip to flow to the cooling air thus lowering chip temperatures.

Referring now to Table 1 there is shown an example of the various thermal resistance components for the additional parallel lid-to-card thermal path resistance $R_2$ which is provided by the present invention and illustrated as path 3-4-5-6-7-8 in FIG. 2. In this particular embodiment of the package illustrated in FIG. 1 the ceramic substrate is glass ceramic with copper vias. The minimum resistance values in column two are modeled on possible package geometry that maximizes heat flow such as larger chip sizes, larger contact areas, higher material thickness, and shorter conduction paths. The maximum resistance values in column three are modeled on possible package geometry that would tend to hinder heat flow, such as smaller chip sizes, smaller contact areas, lower material thickness and longer conduction paths. The actual package geometry will often be dictated by other design constraints such as allowable package overall size. The values in Table 1 represent typical upper and lower design boundaries for the various thermal resistance components achievable for the additional parallel lid-to-card thermal path resistance $R_2$.

TABLE 1

| Component | Minimum ° C./W | Maximum ° C./W | Material |
|---|---|---|---|
| Through Lid | 1.0° C/W | 1.9° C/W | AL 6061 |
| Through Adhesive | 0.5° C/W | 0.75° C/W | GE 3281 |
| Through Vias | 0.19° C/W (225 μm) | 1.43° C/W (900 μm) | glass ceramic/Cu |
| Through BGA/Board | 0.26° C/W | 0.35° C./W | 90/10 solder/Cu |
| Total | 2.0° C/W | 4.4° C/W | |

Referring now to Table 2 there is shown an example of the various thermal resistance components for the additional parallel lid-to-card thermal path resistance $R_2$, except in this particular embodiment of the package illustrated in FIG. 1 the ceramic substrate is alumina with molybdenum vias. Except for these material differences the package geometry design boundaries are the same as those in Table 1.

TABLE 2

| Component | Minimum ° C./W | Maximum ° C./W | Material |
|---|---|---|---|
| Through Lid | 1.0° C/W | 1.9° C/W | AL 6061 |
| Through Adhesive | 0.5° C/W | 0.75° C/W | GE 3281 |
| Through Vias | 0.45° C/W (225 μm) | 0.59° C/W (900 μm) | alumina/moly. |
| Through BGA/Board | 0.26° C/W | 0.35° C./W | 90/10 solder/Cu |
| Total | 2.0° C/W | 3.6° C/W | |

Figure 3:
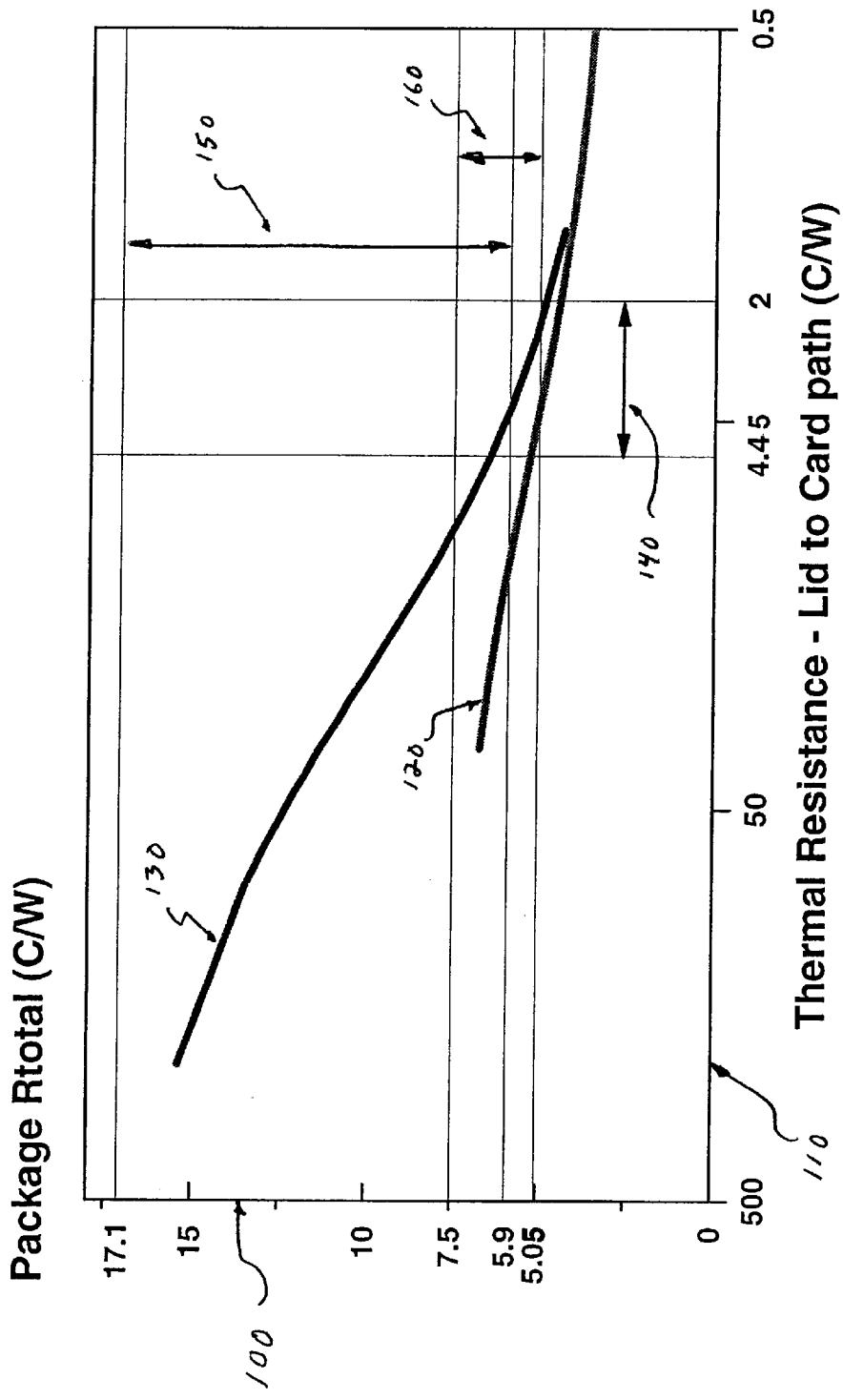
FIG. 3 is a graph illustrating the thermal benefits of the enhanced thermal structure according to the present invention.

Referring now to FIG. 3 there is shown a graph of the thermal performance through the thermal environmental application range for the present invention. The vertical axis 100 represents the total thermal resistance $R_T$ in a package. The horizontal axis 110 represents the additional parallel lid-to-card thermal resistance component $R_2$ created by the present invention. Curve 120 represents the package thermal resistance using a heat sink while curve 130 represents the thermal resistance of the same package without using a heat sink.

In the particular package used to generate the curves shown in FIG. 3, a 4.8 mm² chip is C4 solder joined to a 25 mm² glass ceramic substrate. A silicone elastomer or equivalent adhesive is attached to the chip back side and a portion of the substrate top surface. The substrate is joined to the PCB using standard Ceramic Ball Grid Array (CBGA) attach methods. A cooling environment consisting of air flowing at 1 m/s is assumed. Curve 130 is the case of no heat sink and the addition of an attached 25 mm length×25 mm width×10 mm height heat sink is represented by curve 120.

Table 1 shows the expected achievable bounds on the Lid-to-Card, resistance to be 2.0–4.4° C./W. This is illustrated in FIG. 3 as vertical bounds 140. The resulting package total thermal resistance R. is expected to be approximately 5.0–6.5° C./W without the heat sink attached, and approximately 4.5–5.3° C./W with the heat sink attached. In contrast, the total thermal resistance $R_T$ of the package illustrated in FIG. 3 without the benefit of the additional parallel lid-to-card thermal resistance component $R_2$ is approximately 16° C./W without the heat sink and approximately 7° C./w with the heat sink attached. As shown in FIG. 3 by horizontal boundaries 150 and 160, this is a 65% and 33% decrease in thermal resistance, respectively.

Comparing the example design package performance with and without the secondary thermal path $R_2$ of the present invention, it can be seen that there is an opportunity to eliminate the heat sink if the secondary thermal path is incorporated within the package, and with no net performance loss. Improvements in cost and miniaturization can thereby be obtained. Alternatively, the combination of the secondary heat path $R_2$ of the present invention with a heat sink will yield the lowest overall package total thermal resistance.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A high power density thermal packaging structure comprising:

a printed circuit board having a top surface and a plurality of top surface connection pads;

at least one first horizontal metal plane within said printed circuit board connected to at least one of said plurality of top surface connection pads;

a ceramic substrate having a top surface and a bottom surface and a first plurality of vertical vias which electrically connect said ceramic substrate top surface and said ceramic substrate bottom surface, said ceramic substrate attached to said printed circuit board top surface with a first solder connection between said first plurality of vertical vias and said plurality of printed circuit board top surface connection pads;

an integrated circuit chip having a top surface-and a bottom surface and a plurality of bottom surface connection pads, said integrated circuit chip attached to said ceramic substrate top surface with a second solder connection between-said first plurality of vertical vias and said plurality of integrated circuit chip bottom surface connection pads;

a second plurality of vertical vias arrayed on the perimeter of said ceramic substrate and connecting said ceramic substrate top surface and said ceramic substrate bottom surface, said second plurality of vertical vias attached to said printed circuit board top surface with said first solder connection between said second plurality of vertical vias and said plurality of printed circuit. board top surface connection pads;

a first layer of a thermally conductive elastomer on said integrated circuit chip top surface;

a second layer of a thermally conductive elastomer on a perimeter portion of said ceramic substrate top surface; and a lid having a top surface and a perimeter bottom surface and a recess portion, said recess portion in contact with said first layer of a thermally conductive elastomer and said perimeter bottom surface in contact with said second layer of a thermally conductive elastomer and in thermal contact with said second plurality of vertical vias and attached to said ceramic substrate top surface.

2. The high power density thermal packaging structure of claim 1 further comprising at least one second horizontal metal plane within said ceramic substrate connected to a least one of said second plurality of vias.

3. The high power density thermal packaging structure of claim 1 further comprising;
   a third layer of a thermally conductive elastomer on said lid top surface; and
   a heat sink in contact with said third layer of a thermally conductive elastomer and attached to said lid top surface thereby providing a thermally conductive interface between the lid and the heat sink.

4. The high power density thermal packaging structure of claim 1 wherein said first solder connection is a solder ball grid array.

5. The high power density thermal packaging structure of claim 1 wherein said first solder connection is a column grid array.

6. The high power density thermal packaging structure of claim 1 wherein said first solder connection is a land grid array structure having a land grid array socket contact with a low thermal resistance path to said at least one horizontal ground plane in said printed circuit board.

7. The high power density thermal packaging structure of claim 1 wherein said ceramic substrate is comprised of a cordierite glass ceramic material and said first and second plurality of vertical vias are made from a conductive copper paste.

8. The high power density thermal packaging structure of claim 1 wherein said ceramic substrate is comprised of an alumina material and said first and second plurality of vertical vias are made from a conductive molybdenum paste.

9. The high power density thermal packaging structure of claim 1 wherein said first and second plurality of vertical vias have a diameter of approximately 0.004 inches.

10. The high power density thermal packaging structure of claim 1 wherein said first and second plurality of vertical vias have a via to via spacing of about 225 $\mu$m to about 900 $\mu$m.

11. The high power density thermal packaging structure of claim 1 wherein said first and second layer of a thermally conductive elastomer is a silicone adhesive.

12. The high power density thermal packaging structure of claim 1 wherein said lid is an aluminum material.

13. The high power density thermal packaging structure of claim 2 wherein said at least one second horizontal metal plane is made from a conductive copper paste.

14. The high power density thermal packaging structure of claim 2 wherein said at least one second horizontal metal plane is made from a molybdenum paste.

15. The high power density thermal packaging structure of claim 1 wherein said at least one first horizontal metal plane within said printed circuit board is a copper ground plane.

16. A method for providing a high power density thermal packaging solution comprising the steps of:
   providing a printed circuit board having a top surface and a plurality of top surface connection pads and at least one first horizontal metal plane within said printed circuit board connected to a least one of said plurality of top surface connection pads;
   providing a ceramic substrate having a top surface and a bottom surface and a first plurality of vertical vias which electrically connect said ceramic substrate top surface and said ceramic substrate bottom surface, a second plurality of vertical vias arrayed on the perimeter of said ceramic substrate and connecting said ceramic substrate top surface and said ceramic substrate bottom surface and at least one second horizontal metal plane within said ceramic substrate connected to a least one of said second plurality of vias;
   providing an integrated circuit chip having a top surface and a bottom surface and a plurality of bottom surface connection pads;
   applying a first layer of a thermally conductive elastomer on said integrated circuit chip top surface;
   applying a second layer of a thermally conductive elastomer on a perimeter portion of said ceramic substrate top surface;
   attaching said integrated circuit chip to said ceramic substrate top surface with a first solder connection between said first plurality of vertical vias and said plurality of integrated circuit chip bottom surface connection pads;
   providing a lid having a top surface and a perimeter bottom surface and a recess portion;
   attaching said lid to said integrated circuit chip top surface so that said recess portion is in contact with said first layer of a thermally conductive elastomer and attaching said perimeter bottom surface portion to said ceramic substrate so that said bottom surface portion is in contact with said second layer of a thermally conductive elastomer; and
   attaching said ceramic substrate to said printed circuit board top surface with a second solder connection between said first plurality of vertical vias and said plurality of printed circuit board top surface connection pads-and between said second plurality of vertical vias and said plurality of printed circuit board top surface connection pads, thereby providing an additional parallel lid to card path resistance.

17. The method of claim 16 further comprising the steps of:
   applying a-third layer of a thermally conductive elastomer on said lid top surface; and
   attaching a heat sink on said third layer of a thermally conductive elastomer and said lid top surface thereby providing a thermally conductive interface between said lid and said heat sink.

* * * * *